United States Patent
Wu et al.

(10) Patent No.: US 12,293,929 B2
(45) Date of Patent: May 6, 2025

(54) TRANSFER SYSTEM AND A FIXTURE THEREOF ADAPTABLE TO PERFORMING LEVELLING ALIGNMENT

(71) Applicant: Prilit Optronics, Inc., Tainan (TW)

(72) Inventors: Biing-Seng Wu, Tainan (TW);
Chun-Jen Weng, Tainan (TW);
Chao-Wen Wu, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 0 days.

(21) Appl. No.: 18/385,622

(22) Filed: Oct. 31, 2023

(65) Prior Publication Data
US 2024/0079253 A1    Mar. 7, 2024

Related U.S. Application Data

(63) Continuation of application No. 17/220,638, filed on Apr. 1, 2021, now abandoned.

(51) Int. Cl.
*H01L 21/67*    (2006.01)
*H01L 25/13*    (2006.01)

(52) U.S. Cl.
CPC ........ *H01L 21/67144* (2013.01); *H01L 25/13* (2013.01)

(58) Field of Classification Search
CPC ................................ H01L 21/67144
See application file for complete search history.

(56) References Cited

U.S. PATENT DOCUMENTS

2019/0043843 A1* 2/2019 Liu ................ H01L 21/6835
2021/0339964 A1* 11/2021 Khang ............... H01L 24/75

* cited by examiner

*Primary Examiner* — Ronald P Jarrett
(74) *Attorney, Agent, or Firm* — Donald E. Stout; Stout, Uxa & Buyan, LLP

(57) ABSTRACT

A transfer system adaptable to performing levelling alignment includes a transfer head that picks up micro devices, the transfer head having a plurality of pick-up heads protruded from a bottom surface of the transfer head; and a levelling fixture configured to perform levelling alignment for the transfer head, the levelling fixture having a plurality of cavities that are concave downwards to correspondingly accommodate the pick-up heads respectively.

17 Claims, 6 Drawing Sheets

TRANSFER SYSTEM AND A FIXTURE THEREOF ADAPTABLE TO PERFORMING LEVELLING ALIGNMENT

CROSS-REFERENCE TO RELATED APPLICATIONS

This application is a continuation application under 35 U.S.C. 120 of U.S. application Ser. No. 17/220,638, filed on Apr. 1, 2021, the entire contents of which are herein expressly incorporated by reference.

BACKGROUND OF THE INVENTION

1. Field of the Invention

The present invention generally relates to transferring micro devices, and more particularly to a levelling fixture adaptable to performing levelling alignment.

2. Description of Related Art

A micro light-emitting diode (microLED, mLED or μLED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

During manufacturing a microLED display panel, a pick-up module is used to pick up individual microLEDs, and the microLEDs are then transferred to a display panel. Before picking up the microLEDs, the pick-up module need be pre-adjusted in a levelling alignment stage to make sure that the pick-up module is in a levelled position, such that the pick-up module can pick up microLEDs properly in the later transfer stages. Unfortunately, during the levelling alignment stage, the levelling normal (or perpendicular) force of the pick-up module exerted on a levelling fixture may usually cause damage to the pick-up heads of the pick-up module.

A need has thus arisen to propose a novel scheme to overcome the disadvantages of the conventional transfer system, particularly to prevent damage to the pick-up module while performing the levelling alignment stage.

SUMMARY OF THE INVENTION

In view of the foregoing, it is an object of the embodiment of the present invention to provide a transfer system adaptable to effectively transferring micro devices without damaging to elements of the transfer system.

According to one embodiment, a transfer system adaptable to performing levelling alignment includes a transfer head and a levelling fixture. The transfer head picks up micro devices, the transfer head having a plurality of pick-up heads protruded from a bottom surface of the transfer head. The levelling fixture is configured to perform levelling alignment for the transfer head, the levelling fixture having a plurality of cavities that are concave downwards to correspondingly accommodate the pick-up heads respectively.

DETAILED DESCRIPTION OF THE INVENTION

Figure 1:
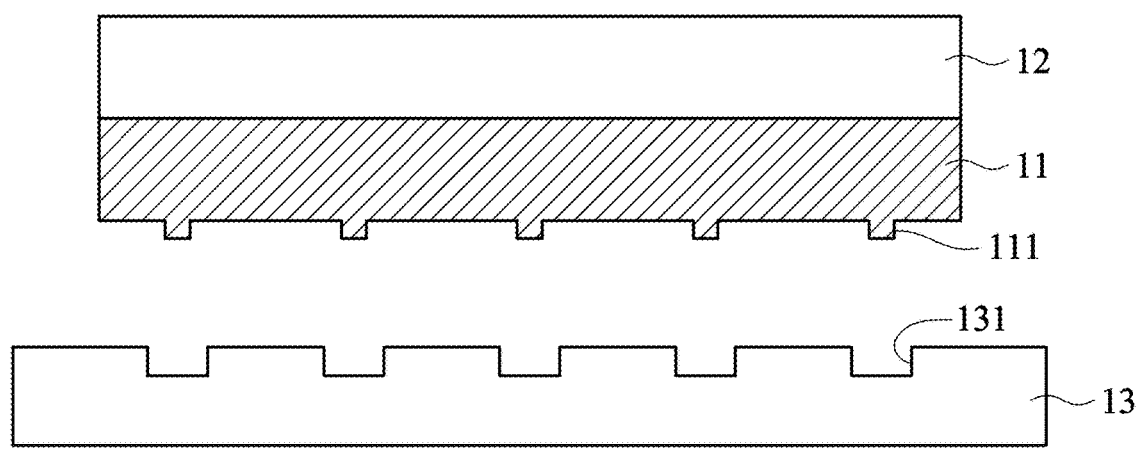
FIG. 1 shows a cross-sectional view of a transfer system adaptable to performing levelling alignment before transferring micro devices according to one embodiment of the present invention.

FIG. 1 shows a cross-sectional view of a transfer system 100 adaptable to performing levelling alignment before transferring micro devices according to one embodiment of the present invention. In the specification, a micro device, such as a micro light-emitting diode, a micro semiconductor device or a micro integrated circuit, refers to a microscopic device that has a size less than 100 micrometers.

In the embodiment, the transfer system 100 may include a transfer head 11 configured to pick up the micro devices (not shown). The transfer head 11 may have a plurality of pick-up heads (commonly called stamps in the pertinent field) 111 protruded from a bottom surface of the transfer head 11. In the embodiment, as the transfer system 100 is specifically adaptable to mass transferring micro devices, the amount of the pick-up heads 111 may be at least hundreds or more. The transfer head 11 may include a device that adopts, for example, vacuum force, electromagnetic force, Van der Waals force or viscous force, to pick up the micro devices. In one embodiment, the transfer head 11, for example, has a size of 5×5 cm.

The transfer system 100 of the embodiment may include an adapter 12, disposed above the transfer head 11, configured to hold (a top surface of) the transfer head 11, for example, by vacuum force or by a clamp.

In the embodiment, the transfer system 100 may include a levelling fixture 13 configured, in companion with the adaptor 12, to perform levelling alignment for the transfer head 11. The levelling fixture 13 of the embodiment may preferably be made of a rigid material such as Sapphire or Granite. According to one aspect of the embodiment, the levelling fixture 13 may have a plurality of cavities 131 that are concave downwards. Particularly, the cavities 131 (of the levelling fixture 13) are arranged to correspondingly accommodate the pick-up heads 111 (of the transfer head 11) respectively. The cavities 131 of the levelling fixture 13 may be made, for example, by etching or laser drilling.

Figure 2:
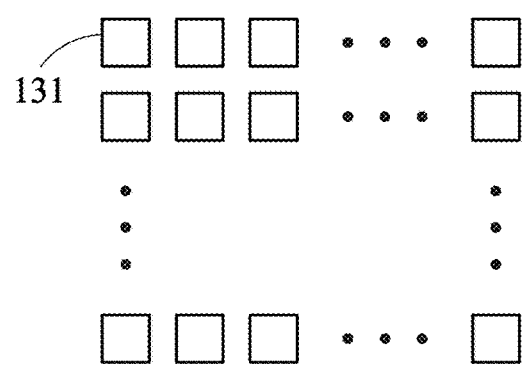
FIG. 2 schematically shows a top view of the levelling fixture of FIG. 1.

FIG. 2 schematically shows a top view of the levelling fixture 13 of FIG. 1. As exemplified in the figure, the cavities 131 are arranged in a matrix form. Although rectangular cavities 131 are exemplified in the embodiment, it is appreciated that the cavities 131 may have shapes other than rectangle.

Figure 3A:
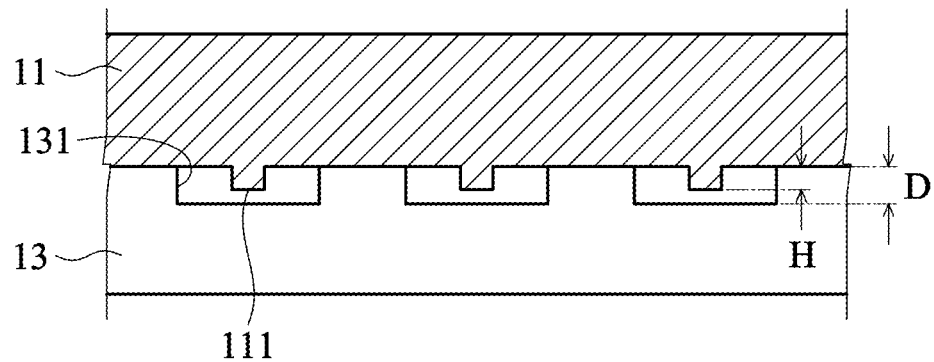
FIG. 3A partially shows an enlarged cross-sectional view of the transfer head aligning with and resting on the levelling fixture.
Figure 3B:
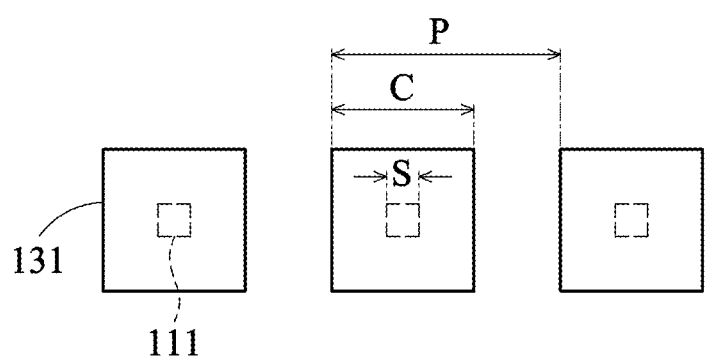
FIG. 3B partially shows an enlarged top view of the cavities and the pick-up heads.

FIG. 3A partially shows an enlarged cross-sectional view of the transfer head 11 aligning with and resting on the levelling fixture 13 with a bottom surface of the transfer head 11 facing a top surface of the levelling fixture 13, and FIG. 3B partially shows an enlarged top view of the cavities 131 and the pick-up heads 111. Specifically, as shown in FIG. 3A, a depth D of the cavity 131 is greater than a height H of the pick-up head 111. As shown in FIG. 3B, a pitch P (e.g., 750 micrometers) of the cavities 131 (i.e., a distance between neighboring cavities 131) is larger than a width C of the cavity 131, which is greater than a width S (e.g., 50 micrometers) of the pick-up head 111.

According to the transfer system 100 as disclosed above, due to the concave cavities 131 of the embodiment, the pick-up heads 111 of the transfer head 11 would not be damaged when the transfer head 11 are touching the levelling fixture 13 while performing a levelling alignment stage to properly fit the transfer head 11 to the levelling fixture 13, before mass transferring micro devices by the transfer head 11.

Figure 4A:
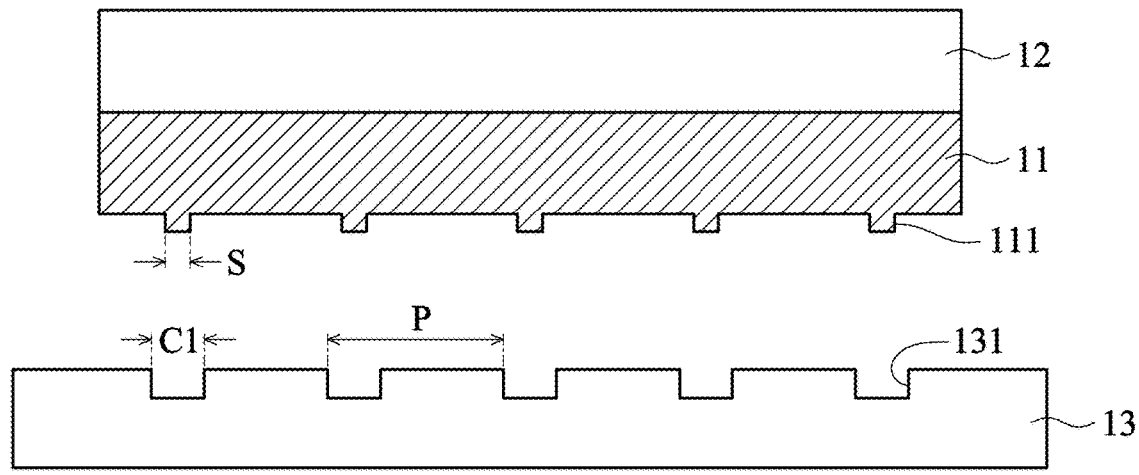
FIG. 4A and FIG. 4B show cross-sectional views of the transfer system according to a first embodiment of the present invention.
Figure 4B:
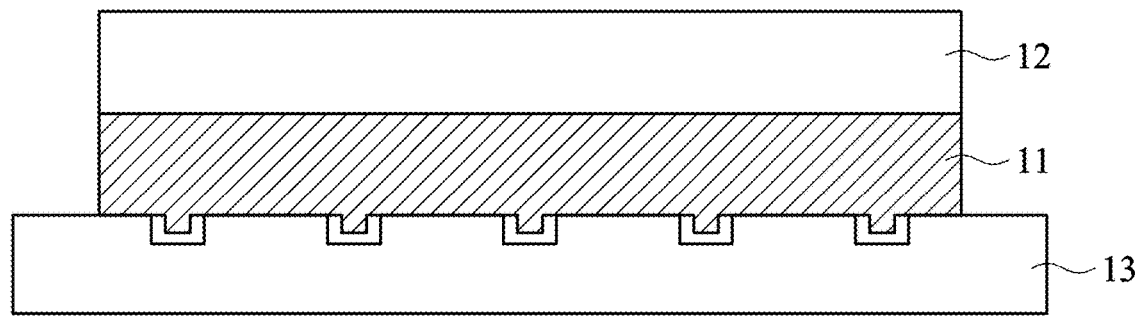

FIG. 4A and FIG. 4B show cross-sectional views of the transfer system 100 according to a first embodiment of the present invention. In the embodiment, a ratio of the width C1 of the cavity 131 to the width S of the pick-up head 111 is greater than 1 and is less than or equal to 1.5 (that is, 1<(C1/S)<=1.5).

Figure 5A:
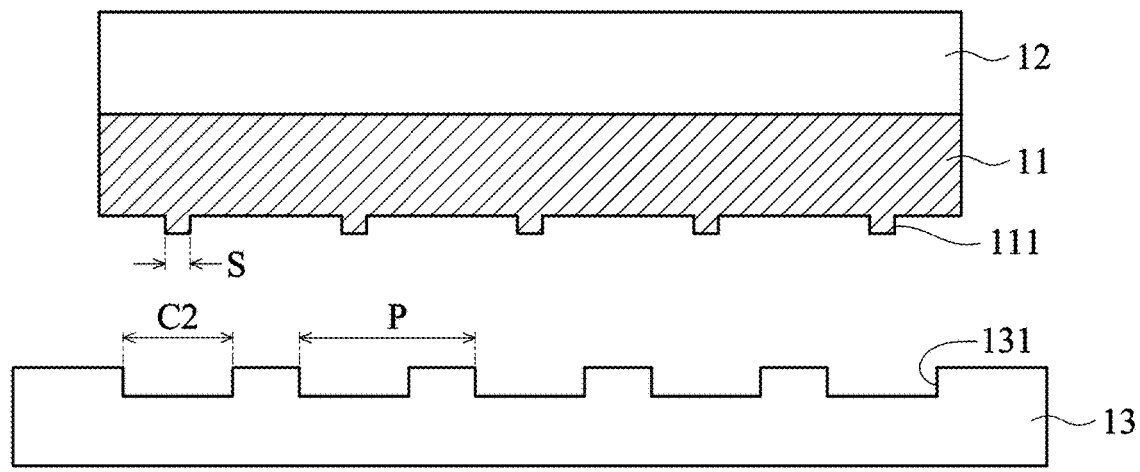
FIG. 5A and FIG. 5B show cross-sectional views of the transfer system according to a second embodiment of the present invention.
Figure 5B:
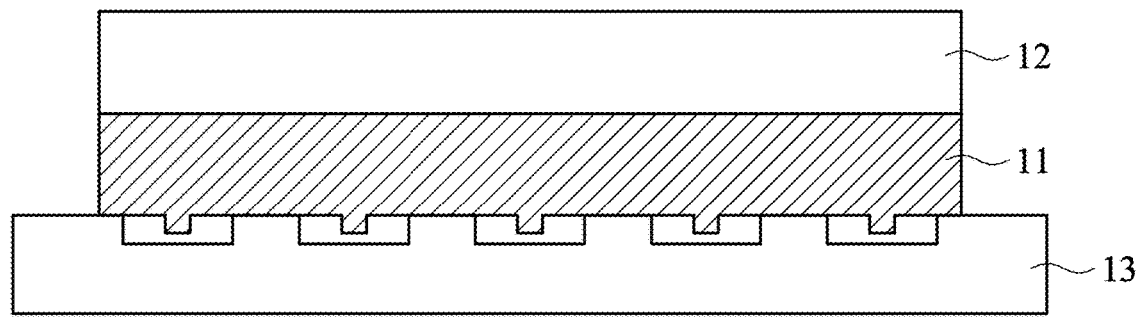

FIG. 5A and FIG. 5B show cross-sectional views of the transfer system 100 according to a second embodiment of the present invention. In the embodiment, a ratio of the width C2 of the cavity 131 to the width S of the pick-up head 111 is greater than 1.5 (that is, 1.5<(C2/S)).

Figure 6A:
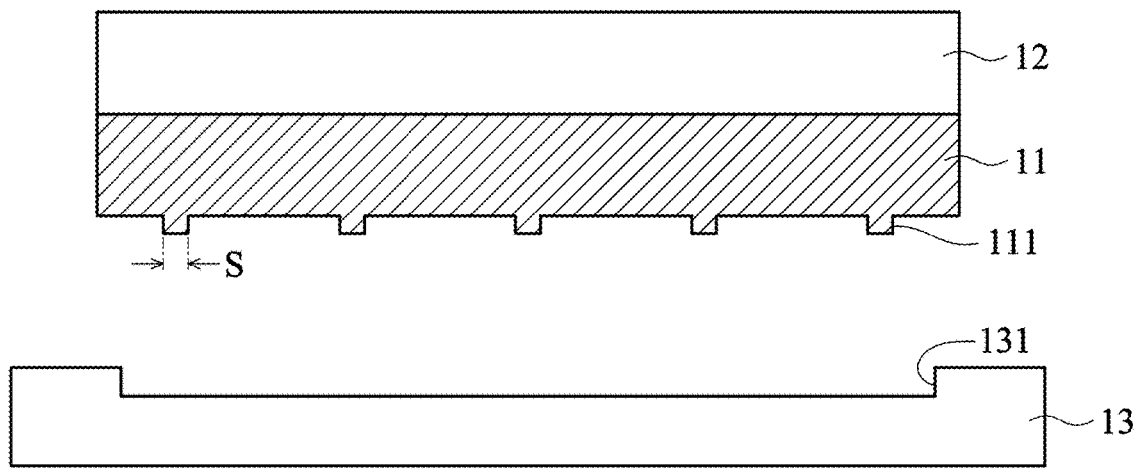
FIG. 6A and FIG. 6B show cross-sectional views of the transfer system according to a third embodiment of the present invention.
Figure 6B:
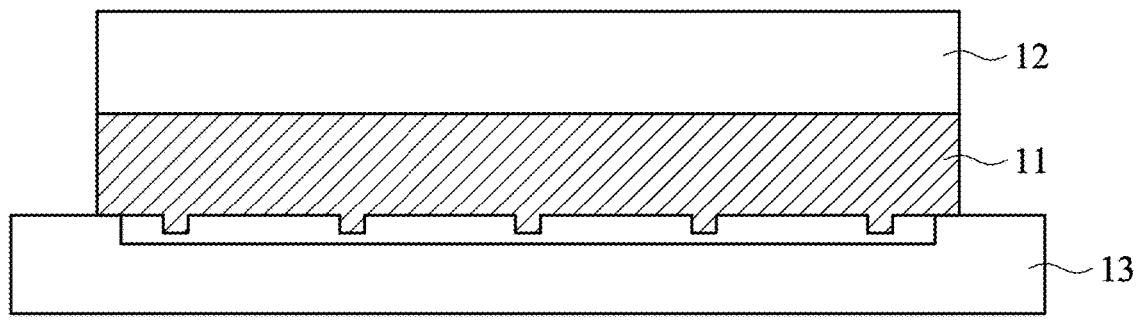

FIG. 6A and FIG. 6B show cross-sectional views of the transfer system 100 according to a third embodiment of the present invention. In the embodiment, the plurality of cavities 131 are interconnected to result in a single cavity to accommodate all the pick-up heads 111 of the transfer head 11.

Figure 7:
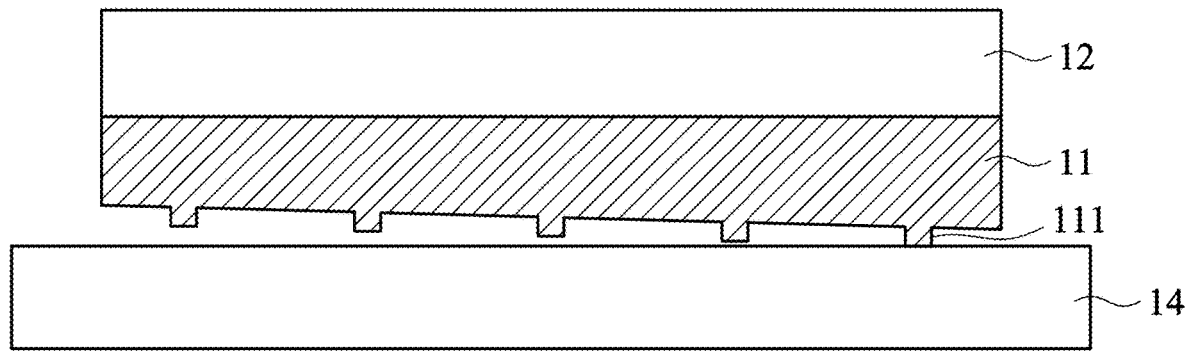
FIG. 7 shows a cross-sectional view of a prior art transfer system that does not adopt the levelling fixture of the present invention, but uses a levelling fixture having a substantially planar top surface while performing a levelling alignment stage.

FIG. 7 shows a cross-sectional view of a transfer system that does not adopt the levelling fixture 13 of the present invention, but uses a levelling fixture 14 having a substantially plane top surface while performing a levelling alignment stage. The levelling normal (or perpendicular) force of the transfer head 11 exerted on the levelling fixture 14 may cause damage to the pick-up heads 111 of the transfer head 11.

Although specific embodiments have been illustrated and described, it will be appreciated by those skilled in the art that various modifications may be made without departing from the scope of the present invention, which is intended to be limited solely by the appended claims.

What is claimed is:

1. A levelling and transfer method, comprising:
providing a transfer head having a plurality of pick-up heads protruded from a bottom surface of the transfer head;
providing a levelling fixture having a plurality of cavities that are concave downwards to correspondingly accommodate the pick-up heads respectively;
resting the transfer head picking no micro devices on the levelling fixture containing no micro devices in the plurality of cavities and the transfer head exerting a levelling normal force on the levelling fixture to make the bottom surface of the transfer head parallel to a top surface of the levelling fixture accordingly in a levelling alignment stage; and
after the levelling alignment stage, picking up micro devices by the plurality of pick-up heads in a transfer stage to place the micro devices on a substrate that is distinct from the levelling fixture.

2. The method of claim 1, wherein the micro devices have a size less than 100 micrometers.

3. The method of claim 1, wherein the transfer head adopts vacuum force, electromagnetic force, Van der Waals force or viscous force to pick up the micro devices.

4. The method of claim 1, further comprising:
providing an adapter disposed above the transfer head to hold the transfer head.

5. The method of claim 1, wherein the levelling fixture is made of a rigid material.

6. The method of claim 1, wherein the cavities of the levelling fixture are made by etching or laser drilling.

7. The method of claim 1, wherein a depth of the cavities is greater than a height of the pick-up heads.

8. The method of claim 1, wherein a pitch of the cavities is larger than a width of the cavities, which is greater than a width of the pick-up heads.

9. The method of claim 8, wherein a ratio of the width of the cavities to the width of the pick-up heads is greater than 1 and is less than or equal to 1.5.

10. The method of claim 1, wherein the plurality of cavities is interconnected to result in a single cavity to accommodate all the pick-up heads of the transfer head.

11. A levelling method, comprising:
providing a levelling fixture having a plurality of cavities that are concave downwards to correspondingly accommodate a plurality of pick-up heads of a transfer head respectively; and
before picking up micro devices by the plurality of pick-up heads in a transfer stage to place the micro devices on a substrate that is distinct from the levelling fixture, resting the transfer head picking no micro devices on the levelling fixture containing no micro devices in the plurality of cavities and the transfer head exerting a levelling normal force on the levelling fixture to make the bottom surface of the transfer head parallel to a top surface of the levelling fixture accordingly in a levelling alignment stage.

12. The method of claim 11, wherein the levelling fixture is made of a rigid material.

13. The method of claim 11, wherein the cavities of the levelling fixture are made by etching or laser drilling.

14. The method of claim 11, wherein a depth of the cavities is greater than a height of the pick-up heads.

15. The method of claim 11, wherein a pitch of the cavities is larger than a width of the cavities, which is greater than a width of the pick-up heads.

16. The method of claim 15, wherein a ratio of the width of the cavities to the width of the pick-up heads is greater than 1 and is less than or equal to 1.5.

17. The method of claim 11, wherein the plurality of cavities is interconnected to result in a single cavity to accommodate all the pick-up heads of the transfer head.

* * * * *